US012635351B2

(12) United States Patent
Dai

(10) Patent No.: US 12,635,351 B2
(45) Date of Patent: May 19, 2026

(54) DISPLAY BASE PLATE, PREPARATION METHOD THEREOF AND DISPLAY DEVICE

(71) Applicant: BOE Technology Group Co., Ltd., Beijing (CN)

(72) Inventor: Qing Dai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 436 days.

(21) Appl. No.: 18/281,789

(22) PCT Filed: Feb. 20, 2023

(86) PCT No.: PCT/CN2023/077143
§ 371 (c)(1),
(2) Date: Sep. 13, 2023

(87) PCT Pub. No.: WO2023/179269
PCT Pub. Date: Sep. 28, 2023

(65) Prior Publication Data
US 2025/0031522 A1 Jan. 23, 2025

(30) Foreign Application Priority Data

Mar. 21, 2022 (CN) .......................... 202210274898.6

(51) Int. Cl.
*H10K 59/122* (2023.01)
*H10K 59/12* (2023.01)
*H10K 59/35* (2023.01)

(52) U.S. Cl.
CPC ....... *H10K 59/122* (2023.02); *H10K 59/1201* (2023.02); *H10K 59/353* (2023.02)

(58) Field of Classification Search
CPC . H10K 59/122; H10K 59/353; H10K 59/1201
See application file for complete search history.

(56) References Cited

U.S. PATENT DOCUMENTS

2007/0200488 A1 8/2007 Ito
2016/0254327 A1 9/2016 Bai et al.
(Continued)

FOREIGN PATENT DOCUMENTS

CN 104299974 A 1/2015
CN 111341807 A 6/2020
(Continued)

*Primary Examiner* — Mariceli Santiago
(74) *Attorney, Agent, or Firm* — WHDA, LLP

(57) ABSTRACT

The present disclosure provides display base plate, preparation method thereof and display device. The display base plate includes plurality of sub-pixels, substrate, and pixel defining layer disposed on side of the substrate, the pixel defining layer is configured for forming opening area of the sub-pixel, and the opening area has long edge and short edge; the plurality of sub-pixels include first sub-pixel and second sub-pixel having the same color and adjacent to each other, the opening area of the first sub-pixel is first opening area having first long edge, the opening area of the second sub-pixel is second opening area having first short edge; the first long edge is at least partially adjacent to the first short edge, height of the pixel defining layer located between the first opening area and second opening area is at least less than that of at least portion of some other pixel defining layers.

20 Claims, 8 Drawing Sheets

(56) References Cited

U.S. PATENT DOCUMENTS

| | | |
|---|---|---|
| 2021/0050396 A1 | 2/2021 | Myung et al. |
| 2022/0262879 A1 | 8/2022 | Cui |
| 2022/0278181 A1 | 9/2022 | Cui |
| 2025/0280692 A1 * | 9/2025 | Yang ................. H10K 59/8052 |

FOREIGN PATENT DOCUMENTS

| | | | | |
|---|---|---|---|---|
| CN | 111341925 A | | 6/2020 | |
| CN | 111584605 A | | 8/2020 | |
| CN | 112951893 A | * | 6/2021 | ............. H10K 50/80 |
| CN | 113270461 A | * | 8/2021 | ............. H10K 71/00 |
| CN | 217387163 U | | 9/2022 | |
| WO | WO-2024239202 A1 | * | 11/2024 | ........... H10K 59/122 |

* cited by examiner

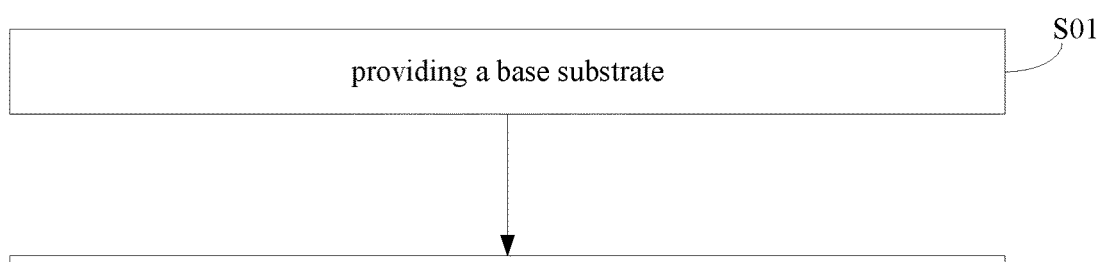

S01 providing a base substrate forming a pixel defining layer on a side of the substrate; wherein the pixel defining layer is configured for forming an opening area of the sub-pixel, and the opening area has a long edge and a short edge; the plurality of sub-pixels include a first sub-pixel and a second sub-pixel having the same color and adjacent to each other, wherein the opening area of the first sub-pixel is a first opening area having a first long edge, and the opening area of the second sub-pixel is a second opening area having a first short edge; the first long edge is at least partially adjacent to the first short edge, and the height of the pixel defining layer located between the first opening area and the second opening area is at least less than the height of of at least portion of some other pixel defining layers.

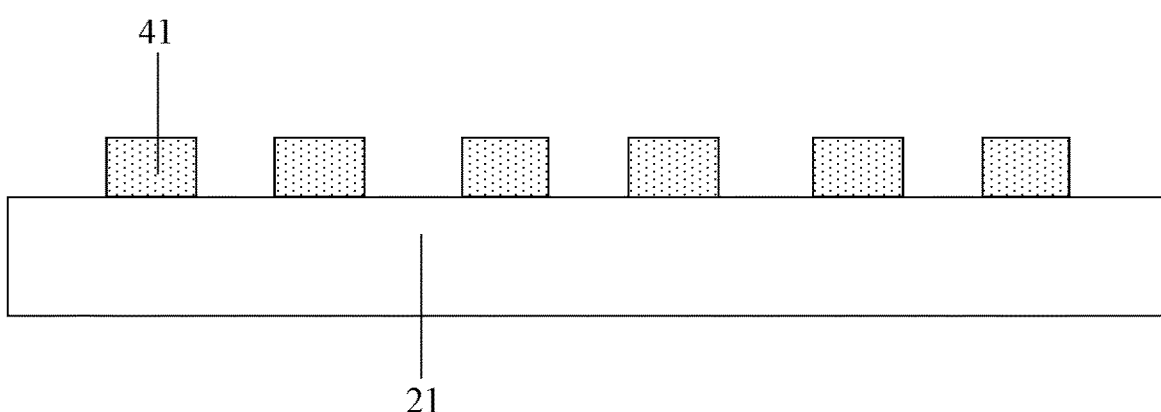

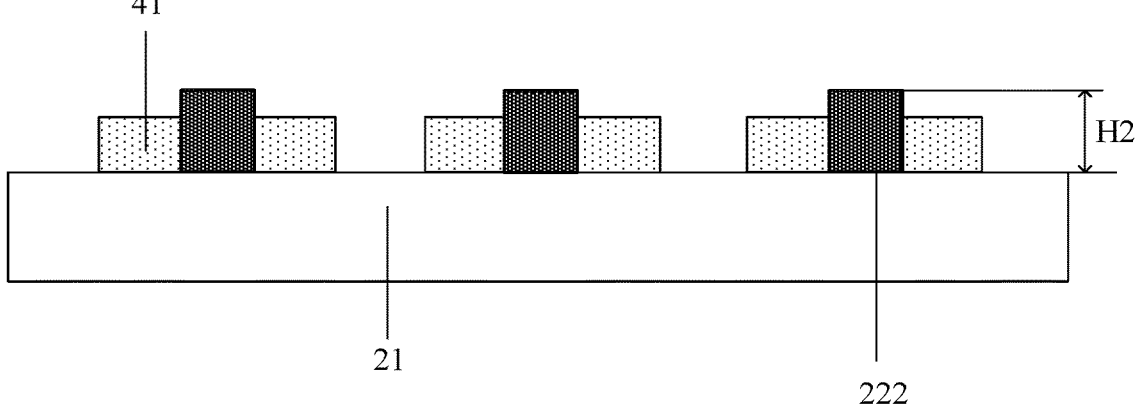

DISPLAY BASE PLATE, PREPARATION METHOD THEREOF AND DISPLAY DEVICE

CROSS-REFERENCE TO RELATED APPLICATION

The present application claims priority to and benefits of Chinese patent application Serial 202210274898.6, and the title of "display base plate, preparation method thereof and display device" filed with the State Intellectual Property Office of P. R. China on Mar. 21, 2022, the entire content of which is incorporated herein by reference.

TECHNICAL FIELD

The present disclosure relates to the technical field of display and, more particularly, to a display base plate, preparation method thereof and display device.

BACKGROUND

An Organic Light-Emitting Diode (OLED) has the advantages of self-luminous, wide viewing angle, fast reaction time, high luminous efficiency, low operation voltage and simple manufacturing process, and is known as a next generation of "star" light-emitting devices.

A Quantum Dot Light-Emitting Diode (QLED) has narrower emission spectrum, purer display color and wider color gamut, so that the QLED has also attracted much attention from the display industry and becomes a powerful candidate for the next generation display technology.

SUMMARY

The present disclosure provides a display base plate, including a plurality of sub-pixels, the display base plate includes:

a substrate, and a pixel defining layer disposed on a side of the substrate, wherein the pixel defining layer is configured for forming an opening area of the sub-pixel, and the opening area has a long edge and a short edge;

the plurality of sub-pixels include a first sub-pixel and a second sub-pixel having the same color and adjacent to each other, wherein the opening area of the first sub-pixel is a first opening area having a first long edge, and the opening area of the second sub-pixel is a second opening area having a first short edge; and the first long edge is at least partially adjacent to the first short edge, and the height of the pixel defining layer located between the first opening area and the second opening area is at least less than that of at least portion of some other pixel defining layers.

In an optional implementation, an orthographic projection of the second opening area in a first direction is located within a range of an orthographic projection of the first opening area in the first direction;

wherein the first direction and the long edge of the second opening area are perpendicular to each other.

In an optional implementation, an included angle between the first long edge and the long edge of the second opening area is larger than or equal to 45° and less than or equal to 135°.

In an optional implementation, the included angle is larger than or equal to 70° and less than or equal to 110°.

In an optional implementation, the first long edge and the first short edge are parallel to each other.

In an optional implementation, the first opening area has a second short edge and the second opening area has a second long edge, and the second long edge and the second short edge are parallel to each other or located on the same straight line.

In an optional implementation, the first opening area has a second short edge and a third short edge which are opposite to each other, and the second opening area has a second long edge and a third long edge which are opposite to each other, and the distance between the second short edge and the second long edge is less than or equal to the distance between the third short edge and the third long edge;

wherein the first sub-pixel and the second sub-pixel form a periodic unit, a plurality of the periodic units are periodically arranged along a second direction, and the two adjacent periodic units include a first periodic unit and a second periodic unit, and the second long edge of the first periodic unit is at least partially adjacent to the third short edge of the second periodic unit.

In an optional implementation, in the second direction, any two adjacent sub-pixels have the same color constitute the first sub-pixel and the second sub-pixel.

In an optional implementation, the plurality of sub-pixels include a third sub-pixel and a fourth sub-pixel having different colors and adjacent to each other, and the long edge of the opening area of the third sub-pixel is at least partially adjacent to and parallel to the long edge of the opening area of the fourth sub-pixel.

In an optional implementation, the plurality of sub-pixels further includes a fifth sub-pixel, wherein the colors of the third sub-pixel, the fourth sub-pixel and the fifth sub-pixel are different from each other, and the third sub-pixel, the fourth sub-pixel and the fifth sub-pixel are arranged periodically and alternately along a third direction sequentially.

In an optional implementation, orthogonal projections of the opening areas of the third sub-pixel, the fourth sub-pixel and the fifth sub-pixel in a fourth direction respectively are completely overlapped; wherein the fourth direction and the third direction are perpendicular to each other.

In an optional implementation, the shape of the opening area is a rectangle, a parallelogram, a waist circle, a race-track shape, an ellipse, a rounded rectangle or a rounded parallelogram.

In an optional implementation, the pixels density of the plurality of sub-pixels is larger than or equal to 200 PPI.

In an optional implementation, a ratio of the length of the long edge to the length of the short edge of the opening area is larger than or equal to 2 and less than or equal to 5.

In an optional implementation, in an extension direction of the first long edge, the first opening area includes a first line segment and a second line segment, and the distance between the first line segment and the opposite edge is less than the distance between the second line segment and the opposite edge; wherein the first line segment is adjacent to the first short edge.

In an optional implementation, the first long edge is further adjacent to a sixth sub-pixel, and the height of a pixel defining layer located between the first opening area and the opening area of the sixth sub-pixel is different from the height of a pixel defining layer located between the first opening area and the second opening area.

In an optional implementation, the pixel defining layer disposed around the opening area includes a plurality of high defining parts and a plurality of low defining parts, and the high defining part and the low defining part are alternately disposed around the opening area; wherein the heights of the high defining part and the low defining part are different.

In an optional implementation, the plurality of high defining parts include a first high defining part and a second high defining part; in a direction surrounding the opening area, the lengths of the first high defining part and the second high defining part are different.

In an optional implementation, at least one of the plurality of high defining parts extends along a curve or a broken line in a direction surrounding the opening area.

In an optional implementation, the pixel defining layer includes:

a first sub-defining part, located between the opening areas of two adjacent sub-pixels of different colors;

a second sub-defining part, located between the opening areas of two adjacent sub-pixels having the same color; wherein the height of the first sub-defining part is higher than the height of the second sub-defining part.

In an optional implementation, the first sub-defining part includes a first material layer and a second material layer disposed in a stacked manner, and the second material layer is located on a side of the first material layer facing away from the substrate, and the first material layer has a lyophilic property and the second material layer has a lyophobic property; and/or, the second sub-defining part has a lyophilic property.

In an optional implementation, the first sub-defining part has a curved structure or a broken line structure, and the second sub-defining part is disposed between the two adjacent first sub-defining parts.

In an optional implementation, the height of the first sub-defining part is larger than or equal to 1 μm; and/or, the height of the second sub-defining part is larger than or equal to 0.05 μm and less than or equal to 0.5 μm.

The present disclosure further provides a display device including the display base plate above-mentioned.

The present disclosure further provides a preparation method of a display base plate, wherein the display base plate includes a plurality of sub-pixels, the preparation method includes:

providing a substrate;

forming a pixel defining layer on a side of the substrate; wherein the pixel defining layer is configured for forming an opening area of the sub-pixel, and the opening area has a long edge and a short edge; the plurality of sub-pixels include a first sub-pixel and a second sub-pixel having the same color and adjacent to each other, wherein the opening area of the first sub-pixel is a first opening area having a first long edge, and the opening area of the second sub-pixel is a second opening area having a first short edge; the first long edge is at least partially adjacent to the first short edge, and the height of the pixel defining layer located between the first opening area and the second opening area is at least less than the height of at least portion of some other pixel defining layers.

The above description is merely a summary of the technical solutions of the present disclosure. In order to more clearly understand the technical means of the present disclosure to enable the implementation according to the content of the description, and to make the above-mentioned and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related technologies, the figures that are required to describe the embodiments or the related technologies will be briefly introduced below. Apparently, the figures that are described below are some embodiments of the present disclosure, and a person skilled in the art may obtain other figures according to these figures without paying creative work. It should be noted that, the proportion in the drawings is merely indicative and does not represent actual proportion, and is merely intended to schematically illustrate the content of the present disclosure. The same or similar reference symbols in the drawings indicate the same or similar elements or elements with the same or similar functions.

FIG. 11 schematically shows a step flow chart of the preparation method of the display base plate;

FIG. 12 schematically shows a cross-sectional structure schematic diagram of the display base plate that has completed the preparation of a first electrode layer;

FIG. 13 schematically shows a cross-sectional structure schematic diagram of the display base plate that has completed the preparation of the second sub-defining part;

DETAILED DESCRIPTION

In order to make the purposes, the technical solutions and the advantages of the embodiments of the present disclosure more clearly, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work will fall within the protection scope of the present disclosure.

In the field of light-emitting devices an organic thin film for example a light-emitting functional layer and the like is generally prepared by adopting a solution process. The solution process includes but is not limited to ink-jet printing, spin coating, screen printing and transfer printing, and the like. In the solution process, the ink in an opening area is prone to occur a "climbing effect". The "climbing effect" refers to that at a position the solution is in contact with the solid, the liquid level of the solution close to the solid-liquid contact position is higher than the liquid level of the solution away from the solid-liquid contact position due to the influence factors for example the characteristics of the solution and surface tension. The "climbing effect" causes a relatively large film thickness at the position close to a retaining wall, and the uneven film thickness in the opening area will further causes uneven pixel brightness, so that the display effect of the display base plate is seriously affected.

Figure 1:
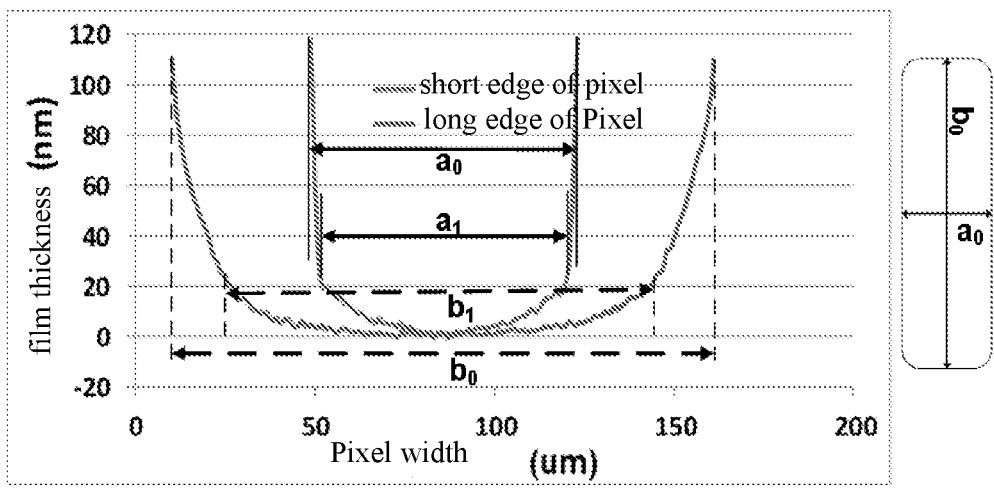
FIG. 1 schematically shows a thickness curve of a film located in an opening area of a display base plate in the related art.

In the related art, the size of the opening area has a larger influence on uniformity of the film thickness. Referring to FIG. 1, shows a thickness curve of a film located in the opening area. The opening area generally has a long edge and a short edge. Under an ideal condition, the film thickness of the opening area is equal everywhere, and the width of the long edge a0 of the opening area is the theoretical width of a long edge of the film, and the width of the short edge b0 of the opening area is the theoretical width of a short edge of the film. However, in the actual situation, due to the influence of process, size of the opening area, materials and other factors, the film thickness in the opening area is nonuniform, so that the actual width of the long edge of the film satisfying the uniformity requirements (for example, the thickness is 20 nm) is less than the theoretical width of the long edge a0, and the actual width of the short edge b1 is less than the theoretical width of the short edge b0. According to the luminous principle of light-emitting devices, the actual width of the long edge of the film should be infinitely close to the theoretical width of the long edge a0, and the actual width of the short edge b1 should be infinitely close to the theoretical width of the short edge b0. That is, the larger the flatness a1/a0 in the long edge direction and b1/b0 in the short edge direction, the better, and the aim is infinitely close to 1.

The inventor found that, the flatness of the film actually formed in the long edge direction and the short edge direction is nonuniform, that is, the value of a1/a0 is quite different from that of b1/b0 under the same process condition. For example, the thickness of the film in the long edge direction is more uniform and the flatness is better. The thickness uniformity and flatness in the short edge direction are poor. Consequently, increasing the size of the opening area in a certain direction is helpful to improve the film thickness uniformity in this direction.

Figure 2:
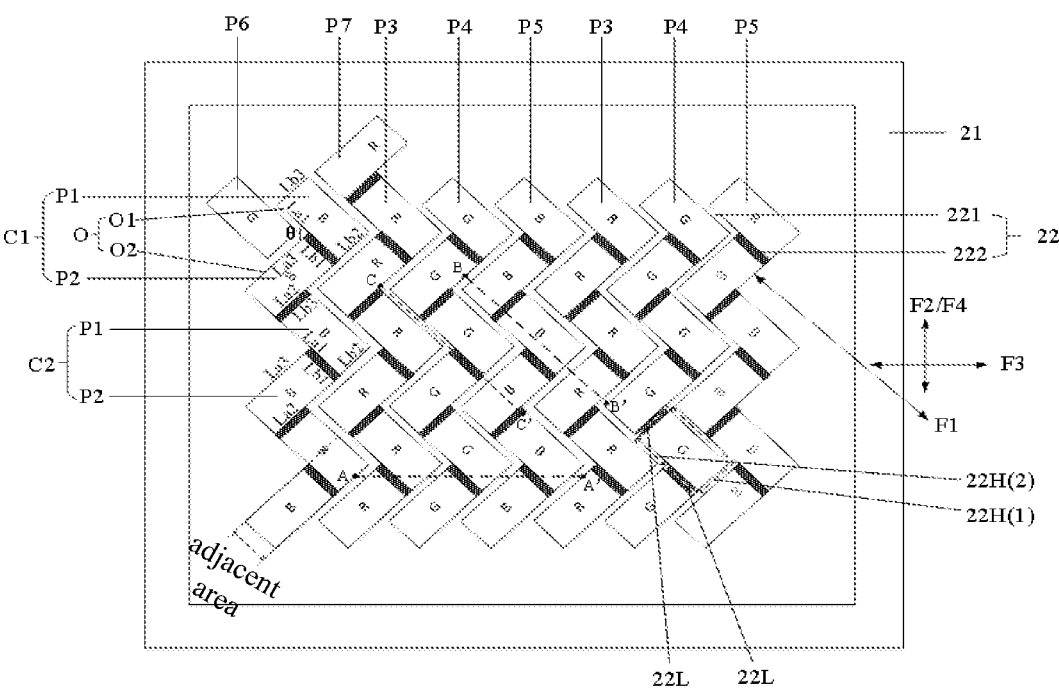
FIG. 2 schematically shows a plane structure schematic diagram of a first display base plate.
Figure 3:
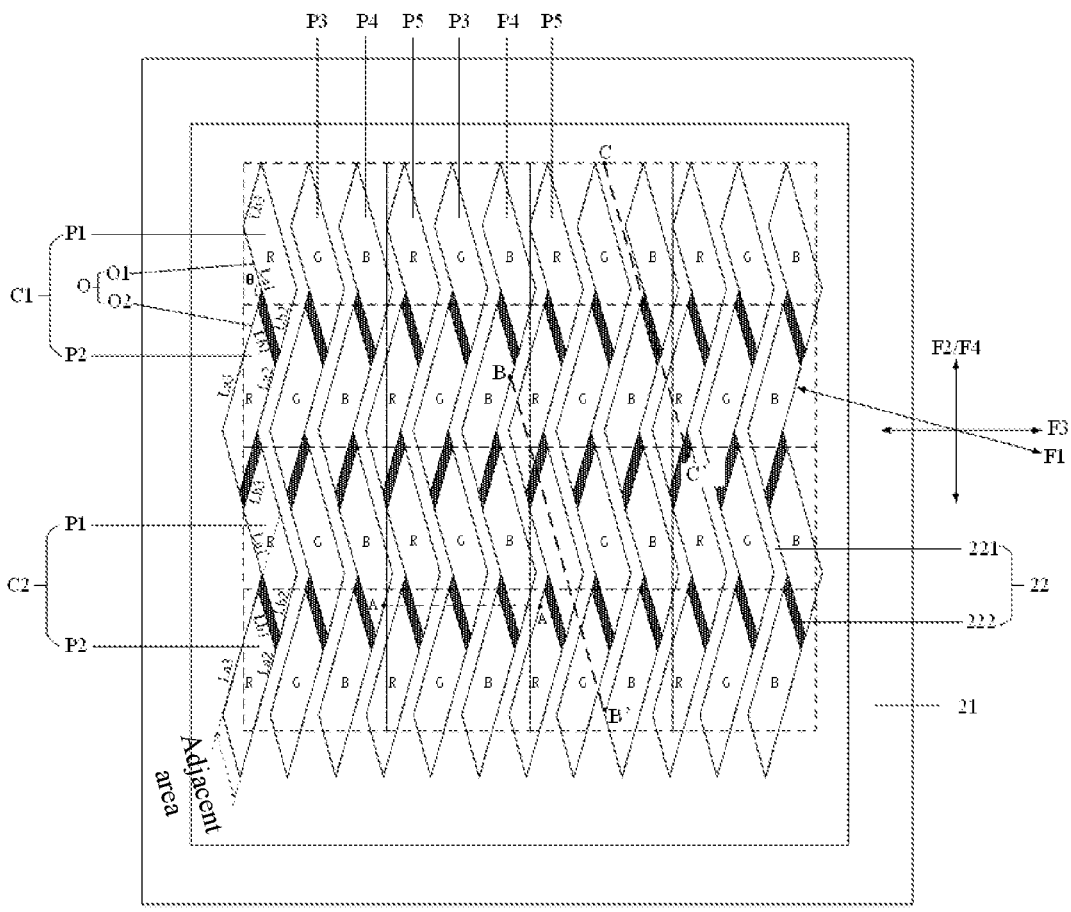
FIG. 3 schematically shows a plane structure schematic diagram of a second display base plate.

In order to solve the above-mentioned problems, an embodiment of the present disclosure provides a display base plate including a plurality of sub-pixels. As shown in FIGS. 2 and 3, the plurality of sub-pixels may have various colors, for example, the plurality of sub-pixels may include a red sub-pixel R, a blue sub-pixel B and a green sub-pixel G, which is not limited by the present disclosure.

As shown in FIGS. 2 and 3, the display base plate includes: a substrate 21, and a pixel defining layer 22 disposed on a side of the substrate, wherein the pixel defining layer 22 is configured for forming an opening area O of the sub-pixel, and the opening area O has a long edge and a short edge.

The plurality of sub-pixels include a first sub-pixel P1 and a second sub-pixel P2 having the same color and adjacent to each other. The opening area of the first sub-pixel P1 is a first opening area O1 having a first long edge La1, and the opening area of the second sub-pixel P2 is a second opening area O2 having a first short edge Lb1.

The first long edge La1 is at least partially adjacent to the first short edge Lb1, and the height of the pixel defining layer located between the first opening area O1 and the second opening area O2 is at least less than that of at least portion of some other pixel defining layers.

The first sub-pixel P1 and the second sub-pixel P2 are two adjacent sub-pixels having the same color. The first long edge La1 is one long edge of the first opening area O1. The first short edge Lb1 is one short edge of the second opening area O2.

As shown in FIGS. 2 and 3, an included angle $\theta$ between the long edge of the first opening area O1 and the long edge of the second opening area O2 may be larger than 0° C. and less than 180°.

In the present disclosure, the height of the pixel defining layer located between the first opening area O1 and the second opening area O2 is at least less than that of at least portion of some other pixel defining layers. That is, a lower pixel defining layer is disposed between the first opening area O1 and the second opening area O2, to ensure that ink may circulate between the first opening area O1 and the second opening area O2.

Since the colors of the first sub-pixel P1 and the second sub-pixel P2 are the same, when a film is formed in the opening area O by a solution process, ink having the same color may flow between the first opening area O1 and the second opening area O2. By arranging the first long edge La1 adjacent to the first short edge Lb1, the size of the first opening area O1 in a short edge direction and the size of the second opening area O2 in a long edge direction are increased in the adjacent areas, equivalently, the diffusion range of the ink is enlarged, so that the ink may be fully diffused and well spread within a large range. Consequently, according to the present disclosure, the film thickness uniformity and flatness within the opening area and between the opening areas may be improved, the brightness uniformity and the display effect of the display base plate is improved.

In addition, by disposing a lower pixel defining layer between the first opening area O1 and the second opening area O2, the ink may circulate between the first opening area O1 and the second opening area O2, so that the requirement for ink drop accuracy in the solution process may be reduced, increase the tolerance for an ink dropping point is increased, and the process complexity is reduced.

Illustratively, the shape of the opening area O may be a rectangle (as shown in FIG. 2) or a rounded rectangle. In this case, the long edge of the rectangle is the long edge of the opening area O, and the short edge of the rectangle is the short edge of the opening area O.

Illustratively, the shape of the opening area O may be a parallelogram (as shown in FIG. 3) or a rounded parallelogram. In this case, the long edge of the parallelogram is the long edge of the opening area O, and the short edge of the parallelogram is the short edge of the opening area O.

Figure 7:
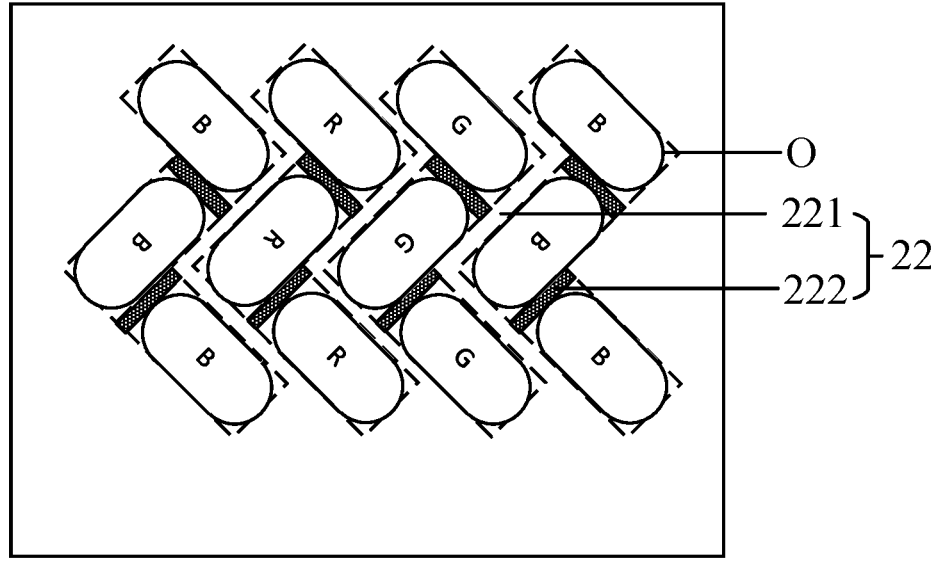
FIG. 7 schematically shows a plane structure schematic diagram of a third display base plate.

Illustratively, the shape of the opening area O may also be a waist circle (as shown in FIG. 7). In this case, the long edge of the minimum enclosing rectangle of this waist circle is the long edge of the opening area O, and the short edge of the minimum enclosing rectangle of the waist circle is the short edge of the opening area O.

Figure 8:
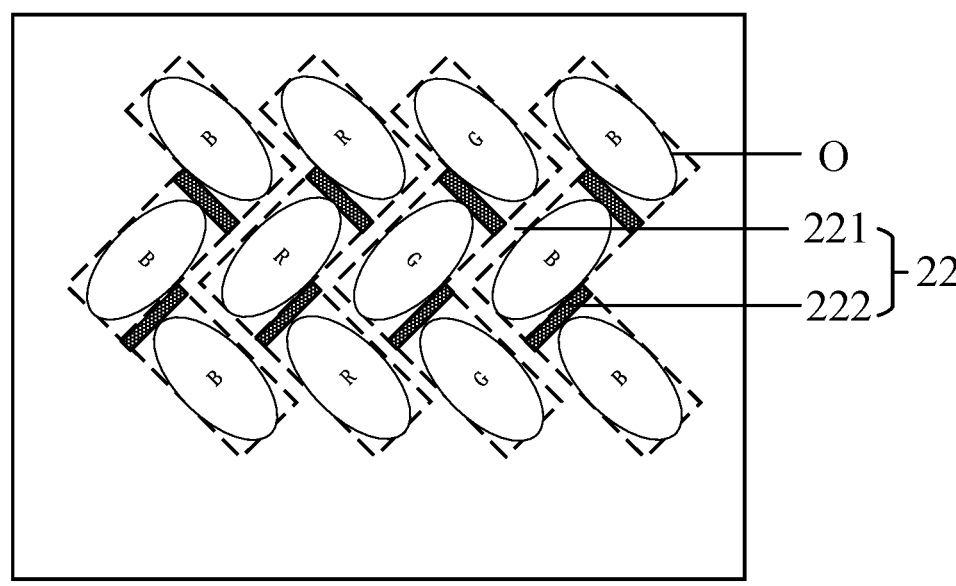
FIG. 8 schematically shows a plane structure schematic diagram of a fourth display base plate.

Illustratively, the shape of the opening area O may also be an ellipse (as shown in FIG. 8). In this case, the long edge of the minimum enclosing rectangle of this ellipse is the long edge of the opening area O, and the short edge of the minimum enclosing rectangle of the ellipse is the short edge of the opening area O.

Illustratively, the shape of the opening area O may also be a racetrack shape. In this case, the long edge of the minimum enclosing rectangle of the racetrack shape is the long edge of the opening area O, and the short edge of the minimum enclosing rectangle of the racetrack shape is the short edge of the opening area O.

In practical application, the shape of the opening area O may also be other polygons, rounded polygons, and shapes having arc shape edges, and so on, Accordingly, the long edge of the opening area O may be the long edge of the minimum enclosing rectangle of the opening area O, and the short edge of the opening area O may be the short edge of the minimum enclosing rectangle of the opening area O. The shape of the opening area O may be designed and determined according to the actual application environment, and is not limited herein.

Figure 4:
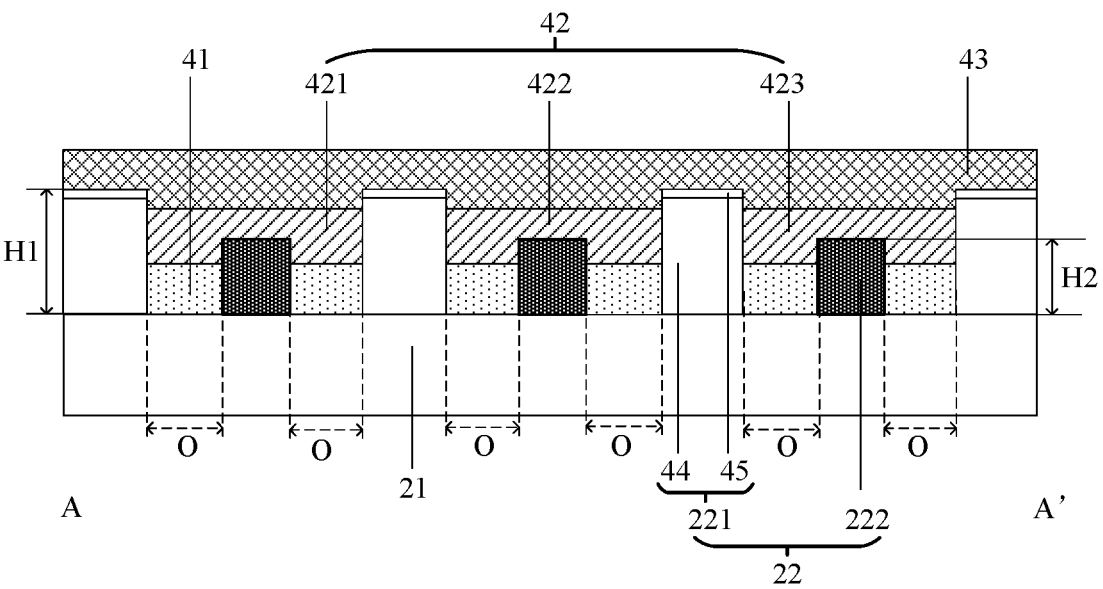
FIG. 4 schematically shows a cross-sectional structural schematic diagram of the display base plate taking along AA' line.
Figure 5:
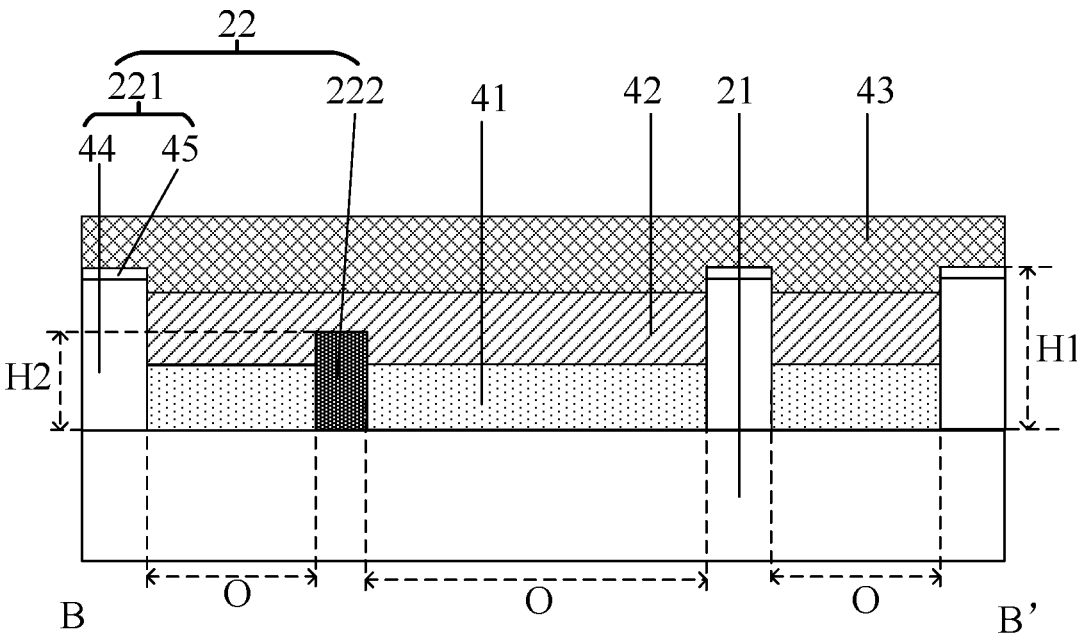
FIG. 5 schematically shows a cross-sectional structural schematic diagram of the display base plate taking along BB' line.
Figure 6:
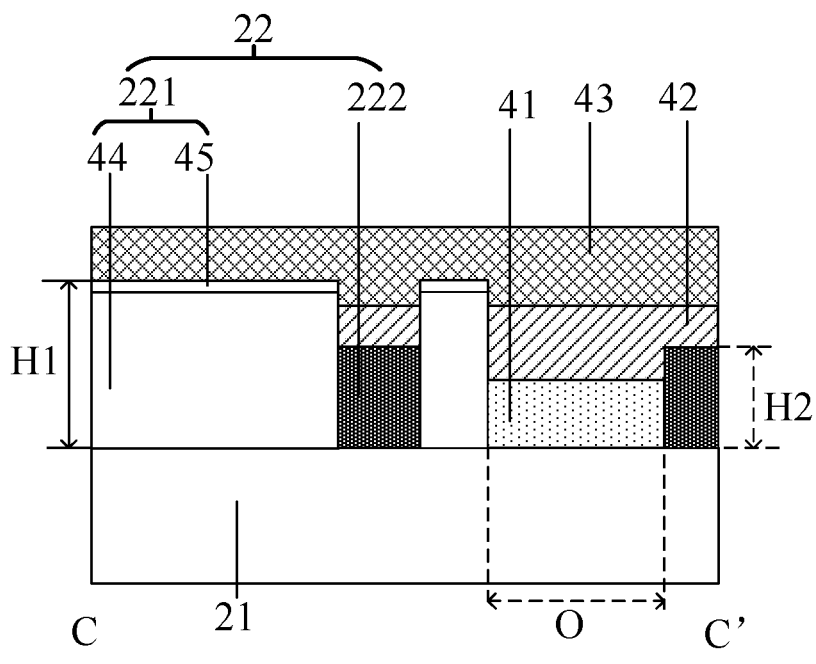
FIG. 6 schematically shows a cross-sectional structural schematic diagram of the display base plate taking along CC' line.

In a particular implementation, as shown in FIGS. 4 to 6, the display base plate may further include an organic material layer located on a side of the pixel defining layer 22 away from the substrate 21. This organic material layer may include at least one of the following layers: a hole injection layer, a hole transport layer, a light-emitting functional layer 42, an electron transport layer, an electron injection layer, and the like that are arrange in a stacked manner. The organic material layer in FIGS. 4 to 6 merely show the light-emitting functional layer 42.

In order to realize electroluminescence, as shown in FIGS. 4 to 6, the display base plate may further include a first electrode layer 41 and a second electrode layer 43.

The first electrode 41 layer is located between the substrate 21 and the pixel defining layer 22. The first electrode 41 layer may include a plurality of the first electrodes 41 disposed at intervals from each other. An orthographic projection of the opening area O on the substrate 21 may be within a range of an orthographic projection of the first electrode 41 at the corresponding position on the substrate 21.

The light-emitting functional layer 42 may include a plurality of light-emitting layers located in the opening area O. In order to realize color light emission, the light-emitting functional layer 42 may include a first color light-emitting layer 421, a second color light-emitting layer 422 and a third color light-emitting layer 423, as shown in FIG. 4. For example, the first color light-emitting layer 421 may be a red light-emitting layer, the second color light-emitting layer 422 may be a green light-emitting layer, and the third color light-emitting layer 423 may be a blue light-emitting layer.

In the present embodiment, the sub-pixels having the same color is the light-emitting layers having the same light-emitting color provided in the opening areas O of these sub-pixels. Since the colors of the first sub-pixel P1 and the second sub-pixel P2 are the same, that is, light-emitting layers having the same color are disposed in the first opening area O1 and the second opening area O2.

As shown in FIGS. 4 to 6, the second electrode layer 43 is disposed on a side of the organic material layer facing away from the substrate 21.

In the opening areas O of every sub-pixel, the first electrode 41, the light-emitting layer and the second electrode layer 43 form a stacked structure, thereby forming an electroluminescent diode.

Illustratively, the material of the light-emitting layer may be an organic light-emitting material, and correspondingly, the electroluminescent diode is an organic light-emitting diode. The material of the light emitting layer may also be quantum dots, and correspondingly, the electroluminescent diode is a quantum dot light emitting diode. It should be noted that, the opening area O of the pixel defining layer 22 is the light-emitting area of the sub-pixel that the electroluminescent diode is located.

In a particular implementation, the display base plate may further include a transistor array layer (not shown in the figure) disposed between the first electrode 41 layer and the substrate 21. The transistor array layer may include a plurality of pixel circuits, and the first electrode 41 may be electrically connected with the pixel circuit, to input a driving current to the first electrode 41 by means of the pixel circuit, and apply a corresponding voltage to the second electrode layer 43, so that driving the light-emitting layer to emit light. For example, the pixel circuit may include a storage capacitor and a transistor electrically connected to the storage capacitor. For example, the pixel circuit may be a 2T1C pixel circuit, a 3T1C pixel circuit or a 7T1C pixel circuit or the like, The 2T1C pixel circuit includes two transistors and one storage capacitor, The 3T1C pixel circuit includes three transistors and one storage capacitor, The 7T1C pixel circuit includes seven transistors and one storage capacitor.

In an optional implementation, as shown in FIGS. 2 and 3, an orthographic projection of the second opening area O2 in a first direction F1 is located within a range of an orthographic projection of the first opening area O1 in the first direction F1.

Wherein, the first direction F1 and the long edge of the second opening area O2 are perpendicular to each other.

According to the present embodiment, the overlapping range between the orthogonal projections of the first opening area O1 and the second opening area O2 in the first direction F1 may be increased to the largest extent, so that the area of the adjacent area is maximized, and the film flatness in the opening area may be improved to the largest extent.

In an optional implementation, an included angle between the first long edge La1 and the long edge of the second opening area O2 is larger than or equal to 45° and less than or equal to 135°.

Particularly, the long edges of the second opening area O2 include a second long edge La2 and a third long edge La3. The included angle θ between the first long edge La1 and the long edge of the second opening area O2 is the included angle θ between the first long edge La1 and the second long edge La2, or the included angle θ between the first long edge La1 and the third long edge La3.

Further, this included angle θ may be larger than or equal to 70° and less than or equal to 110°.

Optionally, this included angle may be 90°, as shown in FIG. 2. When the included angle θ is set to be 90°, the pixel structure design may be simplified.

Optionally, this included angle θ may be an obtuse angle for example 120° and so on, as shown in FIG. 3. In this case, the orthographic projection shape of a pixel unit constructed by a red sub-pixel R, a blue sub-pixel B and a green sub-pixel G on the substrate is closer to a square, thus the abnormality of the image displayed by the display device or the uncoordinated proportion of the displayed image are effectively avoided.

Optionally, the first long edge and the first short edge are parallel to each other. That is, the extending direction of the first long edge La1 and the extending direction of the first short edge Lb1 are parallel to each other.

As shown in FIG. 2 and FIG. 3, since the first long edge La1 and the first short edge Lb1 are parallel to each other, it may be ensured that in an adjacent area range, the extension dimension of the first opening area O1 in the short edge direction is consistent everywhere, and the extension dimension of the second opening area O2 in the long edge direction is consistent everywhere, so that the uniformity of the film thickness may be further improved.

Optionally, the first opening area O1 has a second short edge Lb2 and the second opening area O2 has a second long edge La2, and the second long edge La2 and the second short edge Lb2 are parallel to each other or located on the same straight line (as shown in FIGS. 2 and 3)

When the second long edge La2 and the second short edge Lb2 are located on the same straight line, the space on the display base plate may be fully utilized, which is helpful to improve the pixel density of the display base plate and the aperture ratio of sub-pixel.

In an optional implementation, the first opening area O1 has a second short edge Lb2 and a third short edge Lb3 which are opposite to each other, and the second opening area O2 has a second long edge La2 and a third long edge La3 which are opposite to each other, and the distance between the second short edge Lb2 and the second long edge La2 is less than or equal to the distance between the third short edge Lb3 and the third long edge La3. In FIGS. 2 and 3, since the second short edge Lb2 and the second long edge La2 are located on the same straight line, the distance between them is 0).

Wherein, the first sub-pixel P1 and the second sub-pixel P2 form a periodic unit, a plurality of the periodic units are periodically arranged along a second direction F2, and the two adjacent periodic units include a first periodic unit C1 and a second periodic unit C2, and the second long edge La2 of the first periodic unit C1 is at least partially adjacent to the third short edge Lb3 of the second periodic unit C2.

As shown in FIGS. 2 and 3, the first sub-pixel P1 and the second sub-pixel P2 are arranged alternately and periodically in the second direction F2 sequentially. Every periodic unit includes a first sub-pixel P1 and a second sub-pixel P2.

The second sub-pixel P2 in the first periodic unit C1 is adjacent to the first subpixel P1 in the second periodic unit C2. Particularly, the second long edge La2 of the second opening area O2 in the first periodic unit C1 is adjacent to the third short edge Lb3 of the first opening area O1 in the second periodic unit C2.

Optionally, in the second direction, any two adjacent sub-pixels have the same color constitute the first sub-pixel P1 and the second sub-pixel P2.

As shown in FIG. 2 and FIG. 3, in the second direction F2, the extension directions of the long edges of any two adjacent sub-pixels having the same color and are different, and the long edge of the opening area O of one sub-pixel is adjacent to the short edge of the opening area O of the other sub-pixel.

As shown in FIGS. 2 and 3, since the second sub-pixel P2 in the first periodic unit C1 is adjacent to the first sub-pixel P1 in the second periodic unit C2 and has the same color, the second sub-pixel P2 in the first periodic unit C1 may also constitute the first sub-pixel in a certain periodic unit Ci, and the first sub-pixel P1 in the second periodic unit C2 may also constitute the second sub-pixel in the periodic unit Ci.

As shown in FIG. 2, in the second direction F2, the included angle θ between the long edges of the opening areas O of any two adjacent sub-pixels having the same color is 90°. As shown in FIG. 3, in the second direction F2, the included angle θ between the long edges of the opening areas O of any two adjacent sub-pixels having the same color is an obtuse angle.

In the second direction F2, any two adjacent sub-pixels having the same color constitute the first sub-pixel P1 and the second sub-pixel P2, and since ink may circulate between the opening areas of the first sub-pixel P1 and second sub-pixel P2, so that ink may circulate among all sub-pixels having the same color arranged in the second direction F2, further improving the uniformity of film thickness between pixels.

In an optional implementation, as shown in FIGS. 2 and 3, the plurality of sub-pixels include a third sub-pixel P3 and a fourth sub-pixel P4 having different colors and adjacent to each other, and the long edge of the opening area O of the third sub-pixel P3 is at least partially adjacent to and parallel to the long edge of the opening area O of the fourth sub-pixel.

Optionally, as shown in FIGS. 2 and 3, the short sedges of the third sub-pixel P3 and the fourth sub-pixel P4 are parallel to each other.

As shown in FIGS. 2 and 3, any two adjacent sub-pixels among a plurality of sub-pixels arranged in the third direction F3 may constitute the third sub-pixel P3 and the fourth sub-pixel P4. The long edges of the opening areas O of the sub-pixels arranged in the third direction F3 are parallel to each other, and the short edges of the opening areas O of the sub-pixels arranged in the third direction F3 are parallel to each other.

Optionally, the plurality of sub-pixels may further include a fifth sub-pixel P5, wherein the colors of the third sub-pixel P3, the fourth sub-pixel P4 and the fifth sub-pixel P5 are different from each other, and the third sub-pixel P3, the fourth sub-pixel P4 and the fifth sub-pixel P5 are arranged periodically and alternately along a third direction sequentially.

The color of the third sub-pixel P3 may be red, green or blue. The color of the fourth sub-pixel P4 may be red, green or blue. The color of the fifth sub-pixel P5 may be red, green or blue. The colors of the third sub-pixel P3, the fourth sub-pixel P4 and the fifth sub-pixel P5 are different from each other.

Optionally, orthogonal projections of the opening areas O of the third sub-pixel P3, the fourth sub-pixel P4 and the fifth sub-pixel P5 in a fourth direction respectively are completely overlapped; wherein the fourth direction F4 and the third direction F3 are perpendicular to each other.

In the present embodiment, the fourth direction F4 may be the same as the second direction F2. For example, as shown in FIGS. 2 and 3, the third direction F3 may be the pixel row direction, and the second direction F2 and the fourth direction F4 may be the pixel column direction. Alternatively, the third direction F3 may be the pixel column direction, and the second direction F2 and the fourth direction F4 may be the pixel row direction. These may be designed and determined according to the requirements of practical application, and are not limited herein.

In FIGS. 2 and 3, the extension direction of the sub-pixel arranged in the row direction intersects with the row direction. Two adjacent sub-pixels in the same row have the same extension direction and different colors. The extension directions of two sub-pixels respectively located in adjacent rows are different. Wherein, the extension direction of the sub-pixel refers to the long edge direction of the opening area of this sub-pixel.

As shown in FIG. 2 and FIG. 3, the long edges of opening areas O of the sub-pixels located in two adjacent rows are arranged in a fish-bone shape.

Optionally, the shape of the opening area is a rectangle, a parallelogram, a waist circle, a racetrack shape, an ellipse, a rounded rectangle or a rounded parallelogram. The shape of the opening area O of every sub-pixel may be the same or different.

As shown in FIG. 2, the shape of the opening area O of every sub-pixel is the rectangle. As shown in FIG. 3, the shape of the opening area O of every sub-pixel is the parallelogram.

Figure 9:
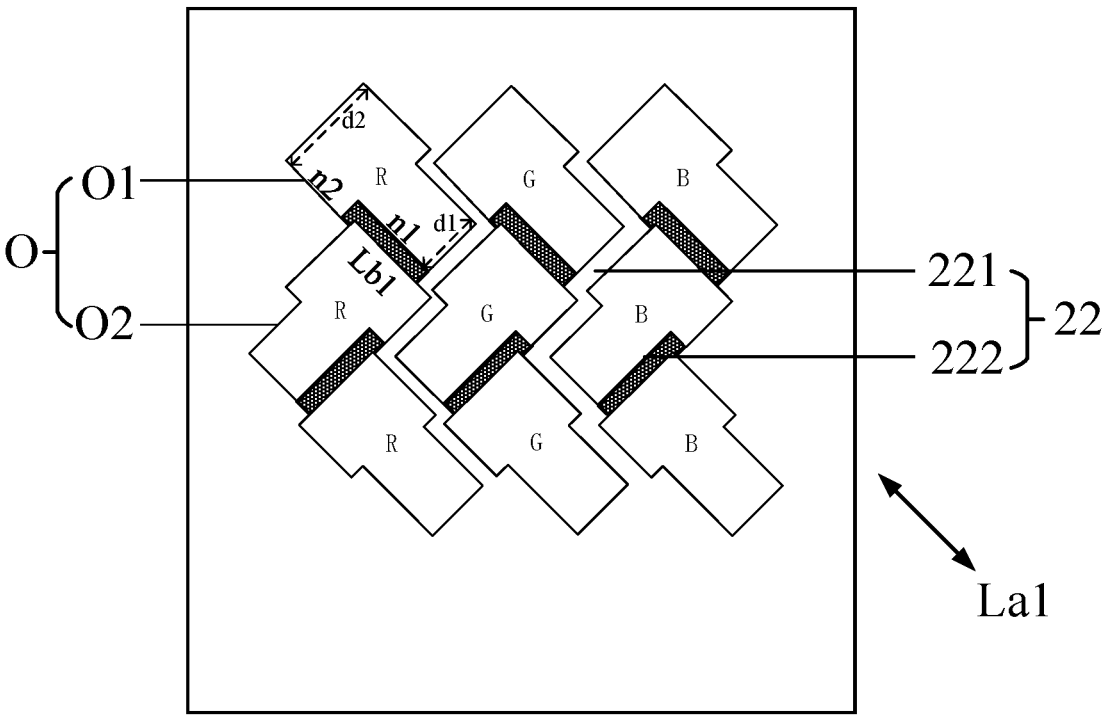
FIG. 9 schematically shows a plane structure schematic diagram of a fifth display base plate.

In an optional implementation, referring to FIG. 9, in an extension direction of the first long edge La1, the first opening area O1 may include a first line segment n1 and a second line segment n2, and the distance d1 between the first line segment n1 and the opposite edge is less than the distance d2 between the second line segment n2 and the opposite edge.

In order to improve the flatness of the film in the whole opening area, the first line segment n1 may be disposed adjacent to the first short edge Lb1.

In the present implementation, the long edge of the opening area O is the long edge of the minimum enclosing rectangle of the opening area O, and the short edge of the opening area O is the short edge of the minimum enclosing rectangle of the opening area O.

The first line segment n1 and the second line segment n2 may be straight line segments or curved line segments and the like.

When the first line segment n1 and the second line segment n2 are straight line segments, the shape of the opening area O is a convex shape (as shown in FIG. 9) or a rounded convex shape. In this case, the long edge of the minimum enclosing rectangle of the convex shape is the long edge of the opening area O, and the short edge of the minimum enclosing rectangle of the convex shape is the short edge of the opening area O. The convex shape may be symmetric or asymmetric (as shown in FIG. 9).

When the first line segment n1 and the second line segment n2 are curved line segments, the shape of the opening area O is similar to a gourd shape. In this case, the shape of the opening area O is similar to the shape of the calabash. In this case, the long edge of the minimum enclosing rectangle of this gourd shape is the long edge of the open area O, and the short edge of the minimum enclosing rectangle of this gourd shape is the short edge of the open area O. Wherein, the gourd shape may be symmetric or asymmetric.

When the first line segment n1 and the second line segment n2 are curved line segments, the first line segment n1 and the second line segment n2 may be the line segments that extension direction is closest to the extension direction of the first long edge La1 among the line segments of the first opening area O1.

Since the distance d1 between the first line segment n1 and the opposite edge thereof is less than the distance d2 between the second line segment n2 and the opposite side thereof, that is, the area between the first line segment n1 and the opposite side thereof corresponds to the narrow opening area, and the area between the second line segment n2 and the opposite edge thereof corresponds to the wide opening area. When the solution process is applied, the ink may be dropped into the wide opening area, so that the requirement for ink drop accuracy in the solution process may be reduced, increase the tolerance for an ink dropping point is increased, and the process complexity is reduced.

The inventors found that, as the resolution of the display base plate is improved, since the size of the opening area O is reduced, the thickness inhomogeneity of the thin film formed in the opening area O becomes more obvious. When the pixel density of the plurality of sub-pixels is larger than or equal to 200 PPI, the thickness uniformity of the film may be significantly improved, and with the increase of pixel density, the improvement effect on the thickness uniformity of the film layer may be more obvious.

Optionally, a ratio of the length of the long edge to the length of the short edge of the opening area is larger than or equal to 2 and less than or equal to 5. Particularly, it may be determined according to the actual effect, which is not limited in the present disclosure.

Taking the first opening area O1 as an example, as shown in FIGS. 2 and 3, the long edge of the first opening area O1 is La1 and the short edge of the first opening area O1 is Lb2, that is, the ratio of the length of La1 to the length of Lb2 is larger than or equal to 2 and less than or equal to 5.

Taking the second opening area O2 as an example, as shown in FIGS. 2 and 3, the long edge of the second opening area O2 is La2 and the short edge of the second opening area O2 is Lb1, that is, the ratio of the length of La2 to the length of Lb1 is larger than or equal to 2 and less than or equal to 5.

Optionally, referring to FIG. 2, the first long edge La1 is further adjacent to a sixth sub-pixel P6, and the height of a pixel defining layer located between the first opening area O1 and the opening area O of the sixth sub-pixel is different from the height of a pixel defining layer located between the first opening area O1 and the second opening area O2.

That is, the height of the pixel defining layer between the first opening area O1 and the opening area O of the sixth sub-pixel P6 is different from that between the first opening area O1 and the second opening area O2.

As shown in FIG. 2, the first long edge La1 is adjacent to the second sub-pixel P2 and the sixth sub-pixel P6 respectively. Particularly, the first long edge La1 is adjacent to the first short edge Lb1 of the opening area of the second sub-pixel P2. The first long edge La1 is adjacent to the long edge of the opening area of the sixth sub-pixel P6.

Wherein, the colors of the first sub-pixel P1 and the second sub-pixel P2 may be the same, and the colors of the first sub-pixel P1 and the sixth sub-pixel P6 may be different. Accordingly, the height of the pixel defining layer between the first opening area O1 and the opening area of the sixth sub-pixel P6 may be higher than that between the first opening area O1 and the second opening area O2.

In the present disclosure, the first sub-pixel P1 may be any sub-pixel in the display base plate. In some examples, the first sub-pixel is a non-edge sub-pixel, which is not limited by the present. Wherein, the edge sub-pixel is the sub-pixel close to the edge of the display base plate.

In an optional implementation, as shown in FIG. 2, the pixel defining layer disposed around the opening area O includes a plurality of high defining parts 22H and a plurality of low defining parts 22L, and the high defining part 22H and the low defining part 22L are alternately disposed around the opening area O.

Wherein the heights of the high defining part 22H and the low defining part 22L are different. The height of the high defining portion 22H may be higher than the height of the low defining portion 22L.

Illustratively, as shown in FIG. 2, two high defining parts 22H and two low defining parts 22L may be disposed around the periphery of the opening area O, and the two high defining parts 22H and the two low defining parts 22L are disposed around the periphery of the opening area in the order of high defining part 22H, low defining part 22L, high defining part 22H and low defining part 22L.

Optionally, referring to FIG. 2, the plurality of high defining parts 22H may include a first high defining part 22H1 and a second high defining part 22H2. In a direction surrounding the opening area O, the lengths of the first high defining part 22H1 and the second high defining part 22H2 are different.

Optionally, referring to FIG. 2, at least one of the plurality of high defining parts 22H extends along a curve or a broken line in a direction surrounding the opening area.

Illustratively, as shown in FIG. 2, the plurality of high defining parts 22H include a first high defining part 22H1 and a second high defining part 22H2. Wherein, the first high defining part 22H1 extends along a broken line in the direction surrounding the opening area. The second high defining portion 22H2 extends along a straight line in the direction surrounding the opening area. The length of the first high defining part 22H1 is larger than the length of the second high defining part 22H2.

In the present implementation, the opening area may be the opening area of non-edge sub-pixels, which is not limited by the present disclosure.

Optionally, the opening area O of every non-edge sub-pixel may include four edges, such as two opposite short edges and two opposite long edges. One of the long edges (for example the first long edge La1 of the first opening area O1 in FIG. 2) may be adjacent to two sub-pixels, and one of the two sub-pixels (for example the second sub-pixel P2 in FIG. 2) may have the same color as this sub-pixel (for example the first sub-pixel P1 in FIG. 2), and the other (for example the sixth sub-pixel P6 in FIG. 2) may have a different color from this sub-pixel (for example the first sub-pixel P1 in FIG. 2). The other long edge (for example the opposite edge of the first long edge La1 of the first opening area O1 in FIG. 2) may be adjacent to two sub-pixels, and these two sub-pixels (for example the third sub-pixel P3 and the seventh sub-pixel P7 in FIG. 2) may have the same color, and the colors of these two sub-pixels are different from that of this sub-pixel (for example the first sub-pixel P1 in FIG. 2). Wherein, one short edge (for example the second short edge Lb2 in FIG. 2) may be adjacent to a sub-pixel with the same color, and the other short edge (for example the third short edge Lb3 in FIG. 2) may be adjacent to a sub-pixel having a different color.

As shown in FIGS. 2 and 3, every non-edge sub-pixel may be adjacent to six sub-pixels, which is not limited by the present disclosure.

In an optional implementation, as shown in FIGS. 2 to 6, the pixel defining layer 22 includes: a first sub-defining part 221, located between the opening areas O of two adjacent sub-pixels of different colors.

The pixel defining layer 22 may further include a second sub-defining part 222, located between the opening areas O of two adjacent sub-pixels having the same color.

Wherein, the height of the first sub-defining part 221 is higher than the height of the second sub-defining part.

In this way, the higher first sub-defining part 221 may prevent the ink from overflow mixing between sub-pixels having different colors, and the lower second sub-defining part 222 may make the ink diffuse among sub-pixels having the same color, to improve the film uniformity within and between pixels, so that the brightness uniformity and the display effect are improved.

Optionally, as shown in FIGS. 4 to 6, the first sub-defining part 221 may include a first material layer 44 and a second material layer 55 disposed in a stacked manner, and the second material layer 45 is located on a side of the first material layer 44 facing away from the substrate.

Wherein, the first material layer 44 has a lyophilic property and the second material layer 45 has a lyophobic property;

By disposing the first material layer 44 having lyophilic property on the side close to the substrate, in the process of inkjet printing, the ink may be evenly spread over the entire opening area O since the lyophilic material layer at the bottom has a stronger attraction to the ink, the entire opening area O may be uniformly spread by the ink, so that the flatness of the film layer in the opening area O is improved. By disposing the second material layer 45 having lyophobic property on the side away from the substrate 10, the lyophobic material at the top has a repulsion effect on the ink, so that on one hand, the climbing height of the ink may be effectively reduced, and on the other hand, color mixing caused by overflow between the sub-pixels of different colors may be avoided.

In a particular implementation, by doping or bonding fluorine-containing substances in the main materials for example polyimide materials or polymethyl methacrylate series materials, and sequentially adopting film coating process, pre-baking process, exposure process and development process, the top of the main materials may have a lyophilic property, to form the structure of the first sub-defining part 221.

Optionally, the second sub-defining part 222 has a lyophilic property. By disposing the second sub-defining part 222, on the one hand, the edge segment difference of the first electrode 41 may be covered to avoid electric leakage breakdown. On the other hand, since the second sub-defining part 222 has the lyophilic property, the fluidity of ink between the sub-pixels of the same color may be effectively improved, so that the thickness of the film between the sub-pixels of the same color is uniform.

In a particular implementation, the materials of the second sub-defining part 222 may include fluorine-free photoresists for example polyimide-based materials or polymethyl methacrylate-based materials.

Optionally, the first sub-defining part 221 has a curved structure or a broken line structure. As shown in FIGS. 2 and 3, in the column direction, the first sub-defining part 221 extends along a broken line, that is, the first sub-defining part 221 has a broken line structure. The pixel defining layer may include the plurality of first sub-defining portions 221 having the broken line structure.

Optionally, the second sub-defining part 222 is disposed between the two adjacent first sub-defining parts. As shown in FIGS. 2 and 3, the plurality of second sub-limiters 222 are disposed at intervals between two adjacent broken line structure.

Optionally, the height of the first sub-defining part 221 is larger than or equal to 1 μm.

Optionally, the height of the second sub-defining part 222 is larger than or equal to 0.05 μm and less than or equal to 0.5 μm.

As shown in FIGS. 2 and 3, the plurality of first sub-defining portions 221 disposed in the second direction are of an integrated structure. The second sub-defining portion 222 is a discontinuous structure disposed at an interval.

FIG. 4 is a cross-sectional structural schematic diagram of the display base plate taking along AA' line according to an exemplary embodiment of the present disclosure. FIG. 5 is a cross-sectional structural schematic diagram of the display base plate taking along BB' line according to an exemplary embodiment of the present disclosure. FIG. 6 is a cross-sectional structural schematic diagram of the display base plate taking along CC' line according to an exemplary embodiment of the present disclosure.

Figure 10:
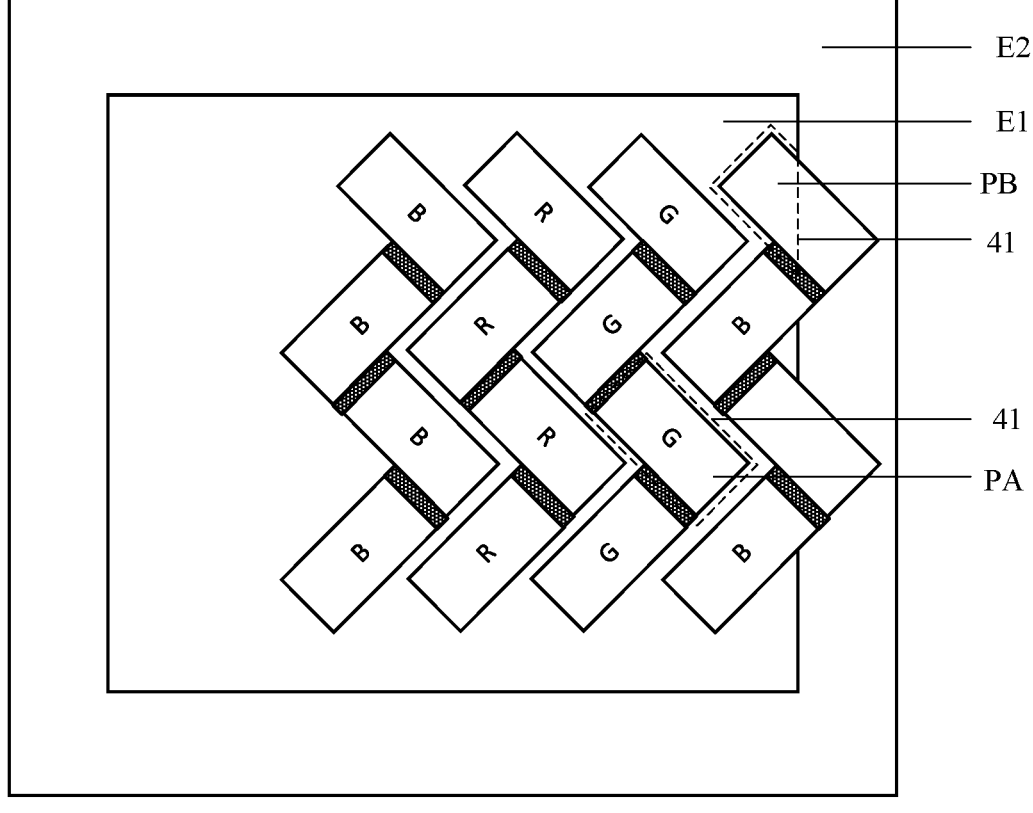
FIG. 10 schematically shows a plane structure schematic diagram of a sixth display base plate.

In a particular implementation, as shown in FIG. 10, the display base plate may include a display area E1 and a non-display area E2. In order to prevent the display base plate provided by the present disclosure from generating a sawtooth effect at the junction of the display area E1 and the non-display area E2, the orthographic projection of the first electrode 41 layer on the substrate 21 may be set to be located within the display area E1. Particularly, the boundary of the orthographic projection of the first electrode 41 layer on the substrate 21 may be set to be coincided with the boundary of the display area E1.

Optionally, the display base plate may include an inner sub-pixel PA and an edge sub-pixel PB. Wherein, the opening area of the internal sub-pixel PA is all located at the display area E1. Part of the opening area of the edge sub-pixel PB is located at the display area E1 and part of the opening area of the edge sub-pixel PB is located at the non-display area E2. The orthographic projection of the first electrode 41 of the edge sub-pixel PB on the substrate 21 (as shown by the dashed box at the position of the edge sub-pixel PB in FIG. 10) may cover the opening area located within the display area E1 without overlapping with the non-display area E2.

Further, in order to prevent the brightness of the edge sub-pixel PB from being inconsistent with that of the inner sub-pixel PA, the driving current of the edge sub-pixel PB may be input by means of an independent signal lead, so that the display brightness of the edge sub-pixel PB and the inner sub-pixel PA may be consistent by independently adjusting the driving current.

It should be understood by a person skilled in the art that in the present disclosure, unless otherwise specified, "thickness" and "height" refer to the dimensions of the corresponding film layer in the direction perpendicular to the plane that the substrate is located, that is, the dimensions in the light-emitting direction of the display base plate.

It should be noted that, in an actual process, due to the limitation of process conditions or other factors, the same among the above-mentioned features are not exactly the same, and some deviations may be existing, so that the same relationship between the above-mentioned features may all fall within the protection scope of the present disclosure as long as the above-mentioned conditions are substantially met. For example, the same may be the same allowed within an allowable error range.

The present disclosure further provides a display device, including the display base plate provided in any above-mentioned embodiment.

A person skilled in the art may understand that the display device has the advantages of the previous display base plate.

It should be noted that, the display device in the present embodiment may be any product or component with two-dimensional (2D) or three-dimensional (3D) display function, for example a display panel, an electronic paper, a mobile phone, a tablet computer, a TV set, a notebook computer, a digital photo frame and a navigator and so on.

The present disclosure further provides a preparation method of the display base plate, wherein, the display base plate includes a plurality of sub-pixels, the preparation method includes:

S01, providing a substrate.

S02, forming a pixel defining layer on a side of the substrate; wherein the pixel defining layer is configured for forming an opening area of the sub-pixel, and the opening area has a long edge and a short edge; the plurality of sub-pixels include a first sub-pixel and a second sub-pixel having the same color and adjacent to each other, wherein the opening area of the first sub-pixel is a first opening area having a first long edge, and the opening area of the second sub-pixel is a second opening area having a first short edge; the first long edge is at least partially adjacent to the first short edge, and the height of the pixel defining layer located between the first opening area and the second opening area is at least less than the height of of at least portion of some other pixel defining layers.

The preparation method provided in the present embodiment may prepare the display base plate provided in any of the above-mentioned embodiments.

The preparation method of the display base plate provided by an embodiment of the present disclosure will be described in detail with reference to FIGS. 12 to 15 and 4 below.

The preparation method of the display base plate provided by an embodiment of the present disclosure may include the following steps:

(1) Providing a substrate 21.

(2) Forming a pattern of a plurality of first electrodes 41 disposed at intervals on a side of the substrate 21, as shown in FIG. 12.

(3) Forming the second sub-defining part 222 on the substrate 21 that the first electrode 41 is formed, as shown in FIG. 13.

Figure 14:
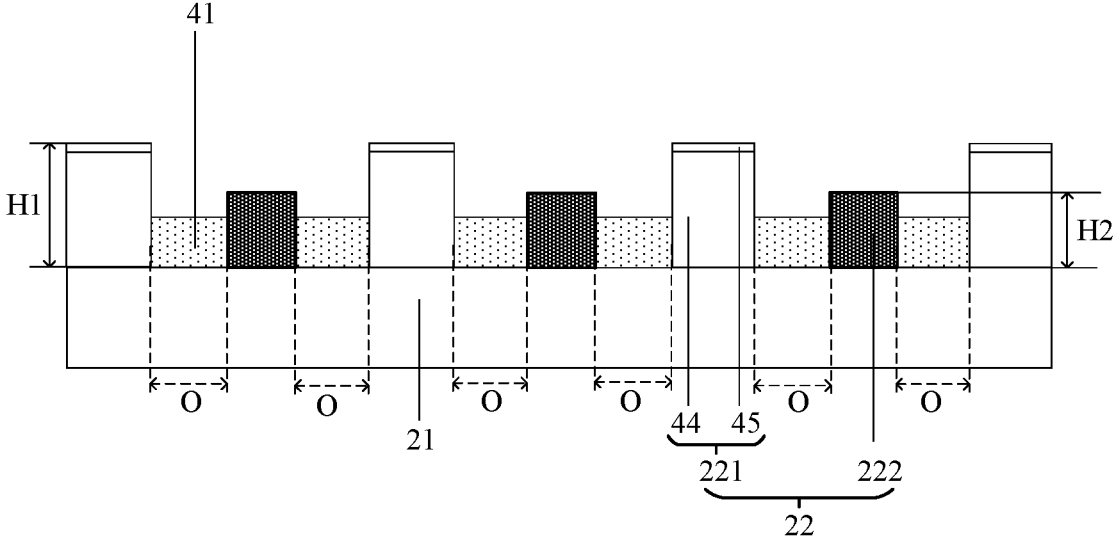
FIG. 14 schematically shows a cross-sectional structure schematic diagram of the display base plate that has completed the preparation of the first sub-defining part.

(4) The first sub-defining part 221 is formed on the substrate 21 that the second sub-defining part 222 is formed, as shown in FIG. 14. The second sub-defining part 222 has a second height H2 in the direction perpendicular to the plane that the substrate 21 is located, and the first sub-defining part 221 has a first height H1 in the direction perpendicular to the plane that the substrate 21 is located, and the first height H1 is higher than the second height H2. The first sub-defining part 221 and the second sub-defining part 222 jointly define a plurality of opening areas O.

Figure 15:
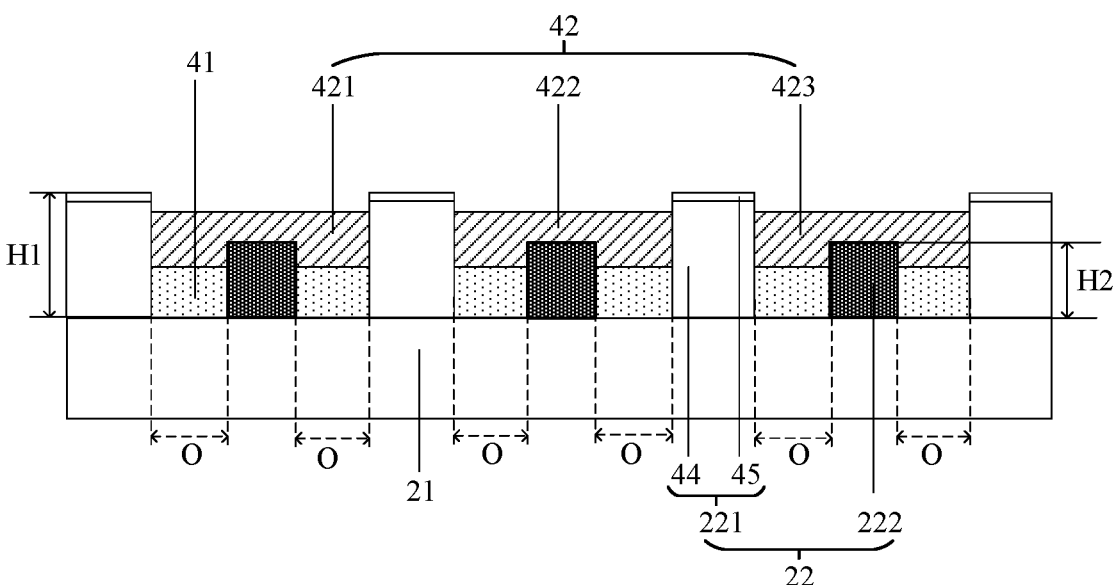
FIG. 15 schematically shows a cross-sectional structure schematic diagram of the display base plate that has completed the preparation of a light-emitting functional layer.

(5) By using an inkjet printing process, the light-emitting layer material is sprayed into each opening area O, so that light-emitting layers of different colors are formed, and a light-emitting functional layer 42 is formed; as shown in FIG. 15.

(6) forming a second electrode layer 43 on the side of the light-emitting functional layer 42 away from the substrate 21; As shown in FIG. 4. The second electrode layer 43 may have an whole structure covering the substrate 21.

Every embodiment in the present specification is described in a progressive way, and every embodiment focuses on the differences from other embodiments, so it is merely necessary to refer to the same and similar parts of every embodiment.

Finally, it should be noted that, unless otherwise defined, the words "first", "second" and similar words used in this article do not indicate any order, number or importance, but are merely used to distinguish different components. Moreover, the terms "include", "include" or any other variation thereof are intended to cover non-exclusive inclusion, so that a process, a method, a commodity or an apparatus including a series of elements includes not merely those elements, but also other elements not explicitly listed or elements inherent to such process, method, commodity or apparatus. Without more restrictions, an element defined by the phrase "including one" does not exclude the existence of other identical elements in the process, method, commodity or apparatus including the element. Similar words for example "connect" or "link" are not limited to physical or mechanical connection, but may include electrical connection, whether direct or indirect.

The display base plate, the preparation method thereof and the display device provided by the present disclosure are described in detail above. In the present disclosure, particular examples are used to explain the principle and implementation of the present disclosure. The description of the above examples is merely used to help understand the method and core idea of the present disclosure. At the same time, according to the idea of the present disclosure, changes may exist in the particular implementation and application scope for a person skilled in the art. To sum up, the contents of the present description should not be understood as limitations to the present disclosure.

Other embodiments of the present disclosure will easily occur to a person skilled in the art after considering the description and practicing the invention disclosed herein. The present disclosure is intended to cover any variations, uses, or adaptations of the present disclosure following the general principles of the present disclosure and including common general knowledge or customary technical means in the art not disclosed in the present disclosure. The description and examples are to be regarded as exemplary merely, with the true scope and spirit of the disclosure being indicated by the following claims.

It should be understood that, the present disclosure is not limited to the precise structure described above and shown in the drawings, and various modifications and changes may be made without departing from its scope. The scope of the present disclosure is limited merely by the appended claims.

As referred to herein, "one embodiment", "an embodiment", or "one or more embodiments" means that a particular feature, structure, or characteristic described in combination with the embodiment is included in at least one embodiment of the present disclosure. In addition, please note that the word examples "in one embodiment" herein do not necessarily refer to the same embodiment.

In the description provided herein, numerous particular details are illustrated. However, it is to be understood that, embodiments of the present disclosure may be practiced without these specific details. In some instances, well-known methods, structures and technologies have not been shown in detail, so that not to obscure the understanding of the present description.

In the claims, any reference signs placed between parentheses shall not be constructed as limitations on the claims. The word "include" does not exclude the presence of elements or steps not listed in a claim. The word "a" or "an" preceding an element does not exclude the presence of a plurality of such elements. The present disclosure may be realized by means of hardware including several different elements and by means of a suitably programmed computer. In the unit claims enumerating several devices, several of these devices may be embodied by the same hardware item. The use of words first, second, and third and the like does not represent any order. These words may be interpreted as names.

Finally, it should be explained that, the above embodiments are merely used to illustrate the technical solution of the present disclosure, but not to limit it. Although the present disclosure has been described in detail with reference to the foregoing embodiments, a person skilled in the art should understand that, it is still possible to modify the technical solutions described in the foregoing embodiments, or to replace some technical features with equivalents.

However, these modifications or substitutions do not make the essence of the corresponding technical solutions deviate from the spirit and scope of the technical solutions of various embodiments of the present disclosure.

The invention claimed is:

1. A display base plate, comprising a plurality of sub-pixels, wherein the display base plate comprises:
   a substrate, and a pixel defining layer disposed at a side of the substrate, wherein the pixel defining layer is configured for forming an opening area of the sub-pixel, and the opening area has a long edge and a short edge;
   the plurality of sub-pixels comprise a first sub-pixel and a second sub-pixel having the same color and adjacent to each other, wherein the opening area of the first sub-pixel is a first opening area having a first long edge, and the opening area of the second sub-pixel is a second opening area having a first short edge; and the first long edge is at least partially adjacent to the first short edge, and the height of the pixel defining layer located between the first opening area and the second opening area is at least less than that of at least portion of some other pixel defining layers.

2. The display base plate according to claim 1, wherein an orthographic projection of the second opening area in a first direction is located within a range of an orthographic projection of the first opening area in the first direction;
   wherein the first direction and the long edge of the second opening area are perpendicular to each other.

3. The display base plate according to claim 1, wherein an included angle between the first long edge and the long edge of the second opening area is larger than or equal to 45° and less than or equal to 135°.

4. The display base plate according to claim 3, wherein the included angle is larger than or equal to 70° and less than or equal to 110°.

5. The display base plate according to claim 1, wherein the first long edge and the first short edge are parallel to each other.

6. The display base plate according to claim 1, wherein the first opening area has a second short edge and the second opening area has a second long edge, and the second long edge and the second short edge are parallel to each other or located on the same straight line.

7. The display base plate according to claim 1, wherein the first opening area has a second short edge and a third short edge which are opposite to each other, and the second opening area has a second long edge and a third long edge which are opposite to each other, and the distance between the second short edge and the second long edge is less than or equal to the distance between the third short edge and the third long edge;
   wherein the first sub-pixel and the second sub-pixel form a periodic unit, a plurality of the periodic units are periodically arranged along a second direction, and the two adjacent periodic units comprise a first periodic unit and a second periodic unit, and the second long edge of the first periodic unit is at least partially adjacent to the third short edge of the second periodic unit.

8. The display base plate according to claim 7, wherein in the second direction, any two adjacent sub-pixels have the same color constitute the first sub-pixel and the second sub-pixel.

9. The display base plate according to claim 1, wherein the plurality of sub-pixels comprise a third sub-pixel and a fourth sub-pixel having different colors and adjacent to each other, and the long edge of the opening area of the third sub-pixel is at least partially adjacent to and parallel to the long edge of the opening area of the fourth sub-pixel.

10. The display base plate according to claim 9, wherein the plurality of sub-pixels further comprises a fifth sub-pixel, wherein the colors of the third sub-pixel, the fourth sub-pixel and the fifth sub-pixel are different from each other, and the third sub-pixel, the fourth sub-pixel and the fifth sub-pixel are arranged periodically and alternately along a third direction sequentially.

11. The display base plate according to claim 10, wherein orthogonal projections of the opening areas of the third sub-pixel, the fourth sub-pixel and the fifth sub-pixel in a fourth direction respectively are completely overlapped; wherein the fourth direction and the third direction are perpendicular to each other.

12. The display base plate according to claim 1, wherein the shape of the opening area is a rectangle, a parallelogram, a waist circle, a racetrack shape, an ellipse, a rounded rectangle or a rounded parallelogram.

13. The display base plate according to claim 1, wherein the pixels density of the plurality of sub-pixels is larger than or equal to 200 PPI.

14. The display base plate according to claim 1, wherein a ratio of the length of the long edge to the length of the short edge of the opening area is larger than or equal to 2 and less than or equal to 5.

15. The display base plate according to claim 1, wherein in an extension direction of the first long edge, the first opening area comprises a first line segment and a second line segment, and the distance between the first line segment and the opposite edge is less than the distance between the second line segment and the opposite edge; wherein the first line segment is adjacent to the first short edge.

16. The display base plate according to claim 1, wherein the first long edge is further adjacent to a sixth sub-pixel, and the height of a pixel defining layer located between the first opening area and the opening area of the sixth sub-pixel is different from the height of a pixel defining layer located between the first opening area and the second opening area.

17. The display base plate according to claim 1, wherein the pixel defining layer disposed around the opening area comprises a plurality of high defining parts and a plurality of low defining parts, and the high defining part and the low defining part are alternately disposed around the opening area; wherein the heights of the high defining part and the low defining part are different.

18. The display base plate according to claim 17, wherein the plurality of high defining parts comprise a first high defining part and a second high defining part; in a direction surrounding the opening area, the lengths of the first high defining part and the second high defining part are different.

19. A display device comprising the display base plate according to claim 1.

20. A preparation method of a display base plate, wherein the display base plate comprises a plurality of sub-pixels, the preparation method comprises:

providing a substrate;

forming a pixel defining layer on a side of the substrate; wherein the pixel defining layer is configured for forming an opening area of the sub-pixel, and the opening area has a long edge and a short edge; the plurality of sub-pixels comprise a first sub-pixel and a second sub-pixel having the same color and adjacent to each other, wherein the opening area of the first sub-pixel is a first opening area having a first long edge, and the opening area of the second sub-pixel is a second opening area having a first short edge; the first long edge is at least partially adjacent to the first short edge, and the height of the pixel defining layer located between the first opening area and the second opening area is at least less than the height of at least portion of some other pixel defining layers.

* * * * *